(12) United States Patent
Boles et al.

(10) Patent No.: US 8,803,721 B1
(45) Date of Patent: Aug. 12, 2014

(54) SYSTEM AND METHOD FOR IMPROVING SPEED AND POWER IN A SWITCHED-CAPACITOR AMPLIFIER

(71) Applicants: William T. Boles, Greensboro, NC (US); Michael R. Elliott, Summerfield, NC (US)

(72) Inventors: William T. Boles, Greensboro, NC (US); Michael R. Elliott, Summerfield, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/801,317

(22) Filed: Mar. 13, 2013

(51) Int. Cl.
*H03M 1/66* (2006.01)

(52) U.S. Cl.
USPC ............ 341/150; 341/144; 341/161; 341/162

(58) Field of Classification Search
USPC .................................. 341/144, 150, 161–162
See application file for complete search history.

(56) References Cited

U.S. PATENT DOCUMENTS

| | | | |
|---|---|---|---|
| 6,859,159 B2 * | 2/2005 | Michalski | 341/172 |
| 7,012,463 B2 | 3/2006 | Nairn | |
| 7,157,955 B2 * | 1/2007 | Wei | 327/337 |
| 7,279,986 B2 * | 10/2007 | Ali | 330/311 |
| 7,889,004 B1 | 2/2011 | Murden, II et al. | |

* cited by examiner

*Primary Examiner* — Khai M Nguyen
(74) *Attorney, Agent, or Firm* — Kenyon & Kenyon, LLP

(57) ABSTRACT

A multiplying analog-to-digital converter ("MDAC") that reduces the power consumption of the MDAC by at least 2.3 times by improving the feedback factor. The amplifier may include a feed forward approach in which the input capacitor (also referred to as "sampling capacitor") is buffered by a common gate amplifier to improve bandwidth by removing input and parasitic capacitance terms from the global feedback loss. THe amplifier may also use an alternate form of local compensation, for example, cascode compensation. The amplifier may also further include an alternate way to reduce parasitic capacitance with a buffer.

18 Claims, 9 Drawing Sheets

200

310

350

400

500

630

650

610

730

710

800

SYSTEM AND METHOD FOR IMPROVING SPEED AND POWER IN A SWITCHED-CAPACITOR AMPLIFIER

FIELD OF THE INVENTION

The present invention relates to amplifiers, more specifically it relates to improving speed and power in a switched-capacitor amplifier such as a multiplying digital-to-analog converter (MDAC).

BACKGROUND INFORMATION

Analog-to-digital converters (ADCs) are used in electronic devices to convert an analog signal to a digital signal. ADCs can be designed in a number of different architectures. One conventional ADC architecture is the pipeline ADC. A pipeline ADC, as illustrated in FIG. 1A, operates on discrete time signals, and therefore mathematical operations, sample-and-hold, DAC, and gain can all be performed in a single switched-capacitor circuit such as an MDAC. An MDAC is a high-gain and high-bandwidth amplifier with capacitive feedback.

In analog design, it is ideal to minimize power consumed and maximize speed. However, in modern high speed switched-capacitor CMOS pipeline ADCs, the MDAC is a major contributor in power consumption and limitation of clock rate. Current architectures of MDAC amplifiers, whether single- or multi-stage, have inherently limited efficiency because loop-gain is attenuated by significant loss in the feedback, in part due to significant parasitic capacitors on the summation node (such as node N3 of FIG. 1C). If the loop-gain can be increased with a topology change or reduction of the parasitic capacitance, then a more efficient amplifier can be built where settling time is reduced (increased bandwidth) and power can be minimized.

Conventional techniques have limitations in the settling response due to non-dominate poles. In addition, these non-dominate poles are typically inside a global feedback loop with a sampling capacitor and a feedback capacitor, which greatly increases the sensitivity of the system and the difficulty of controlling the system. Thus, there also exists a need to reduce the sensitivity of the system and improve the stability of the system, for example by removing the poles from inside the feedback loop.

SUMMARY OF THE INVENTION

The present invention provides for an MDAC that reduces the power consumption of the MDAC by at least 2.3 times by eliminating the global feedback and improving the local feedback factor. In a first embodiment, the amplifier includes a feed forward approach in which the input capacitor (also referred to as "sampling capacitor") is buffered by a common gate amplifier to improve bandwidth by removing input and parasitic capacitance terms from the global feedback loss. In a second embodiment, which may incorporate the same features as the first embodiment, local compensation is achieved by means of cascode compensation. In a third embodiment, which may incorporate the same features as the first and second embodiments, the bandwidth is improved by reducing the parasitic capacitance with a buffer.

DETAILED DESCRIPTION

Figure 1A:
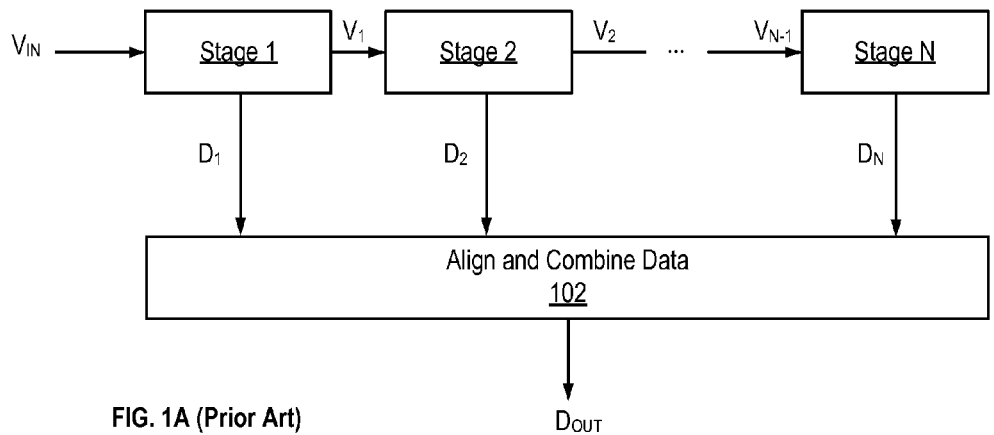
FIG. 1A shows a conventional pipeline ADC.

FIG. 1A shows a conventional pipeline ADC. Several low resolution stages (Stage 1, 2, . . . N) are cascaded to obtain high overall resolution. Each stage operates concurrently and performs coarse analog to digital conversion and computes its quantization error (as referred to as "residue"). The quantization errors are factored into a data aligner and combiner 102, which outputs a digital signal $D_{OUT}$. A disadvantage is that throughput is limited by the speed of a single stage. However, analog circuit non-idealities can be corrected by digital calibration.

Figure 1B:
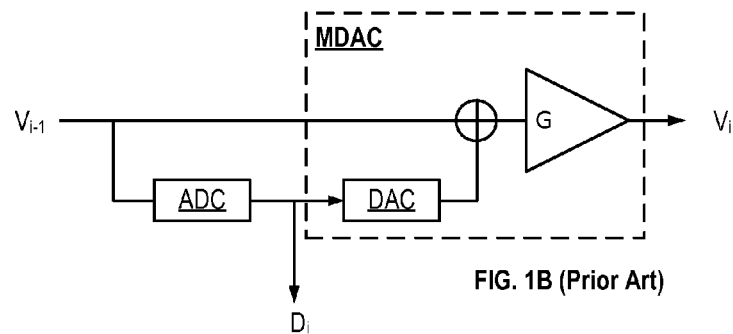
FIG. 1B is a block diagram of a conventional MDAC that may be used in the pipeline ADC of FIG. 1A.

FIG. 1B is a block diagram of a single stage that may be used in the pipeline ADC of FIG. 1A. The stage includes an MDAC shown within dashed lines. The MDAC has a gain block $G_m$ (also referred to as an "inter-stage gain element") for improving noise, subsequent matching, and power dissipation in the pipeline ADC. However, as discussed above, G (the active gain block) is a major contributor to power consumption and limitation of clock rate.

Figure 1C:
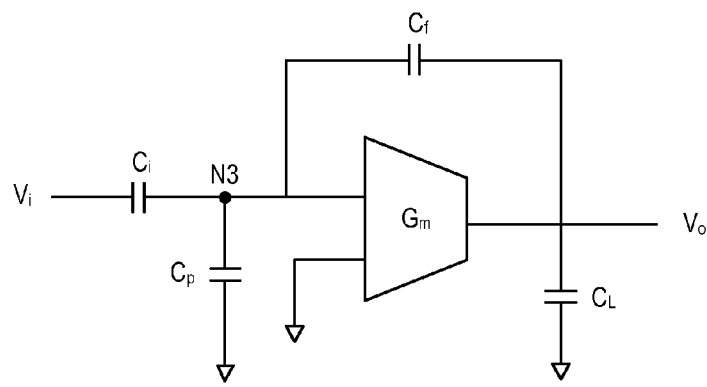
FIG. 1C is a circuit diagram of a conventional MDAC.

FIG. 1C is a circuit diagram of a conventional MDAC. In conventional architectures, the residue gain is generated by an amplifier with transconductance $G_m$, sample cap Ci, and capacitive feedback $C_F$. Parasitics at the summing junction N3 are modeled by capacitor $C_p$. $C_p$ is typically on the order of the input sample capacitance $C_i$, and may be much worse for split DAC capacitors and inter-leaving structures. Assuming load capacitance $C_L \gg C_F$, the transfer function of the MDAC of FIG. 1C is represented by:

$$\frac{V_o}{V_i} = -\frac{C_t}{C_f} \cdot \frac{1 - s \cdot \frac{C_f}{G_m(s)}}{1 + s \cdot \left(\frac{C_{\mathit{eff}}}{G_m(s)}\right)}$$

where the unity gain bandwidth pole is given by:

$$s = \frac{-G_m(s)}{C_{\mathit{eff}}}$$

and the effective capacitance is given by:

$$C_{\mathit{eff}} = C_i + C_{p1} + C_L\left(\frac{C_i + C_{p1}}{C_f} + 1\right)$$

There is a penalty to bandwidth, because the feedback factor is given by the ratio of the feedback capacitance to the sum of all capacitances, i.e., $F=C_f/(C_f+C_i+C_p)$ For example, when there is a gain of 4 in the MDAC stage (2.5-bit stage), the feedback factor is approximately ⅕. For example, if there is a gain of 8, the feedback factor degrades more.

The present invention provides for an MDAC with improved efficiency. In an embodiment, the amplifier includes a feed forward approach in which the input capacitor (also referred to as "sampling capacitor") is buffered by a common gate amplifier to improve bandwidth by removing input and parasitic capacitance terms ($C_i$ and $C_p$ of FIG. 1C) from the global feedback loss. In another embodiment, local compensation is achieved by means of cascode compensation. The MDAC of the present invention has a feedback factor of about ⅓. This improves the bandwidth by at least 2.3 times for a gain of 4, and more for higher gain MDAC stages. As contrasted with the Gm of conventional designs in which the second stage's non-dominate pole is placed three to four times beyond the dominate pole, the present invention relaxes the Gm, because the two poles are not inside the feedback loop and therefore, stability requirements for the two poles are relaxed. In a third embodiment, the MDAC bandwidth is improved by reducing the parasitic capacitance with a buffer at a cost of efficiency.

Figure 2:
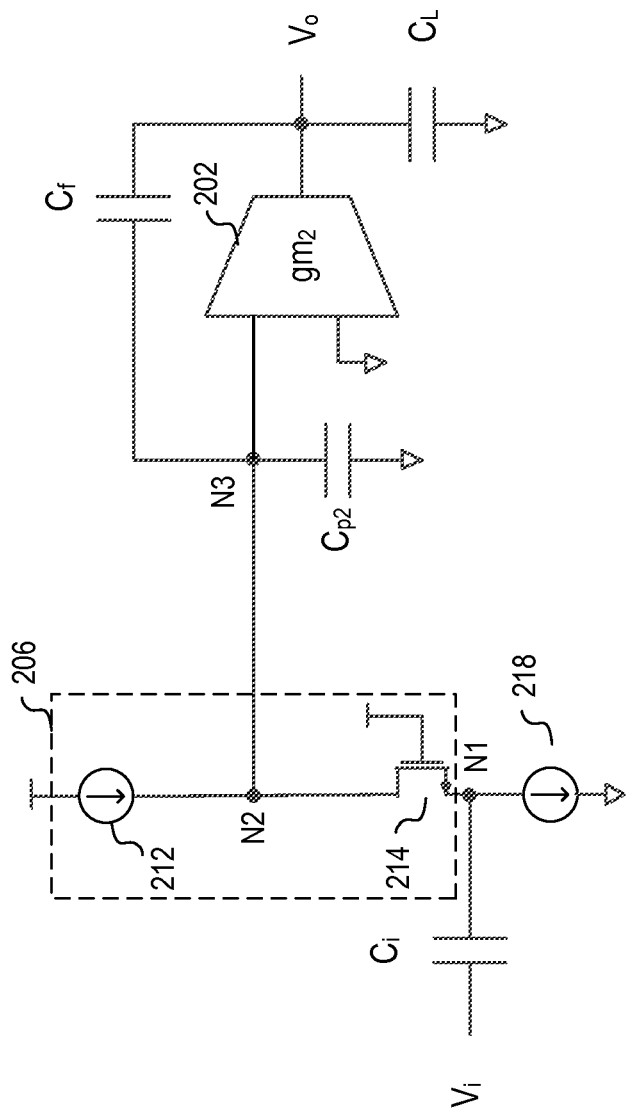
FIG. 2 is a simplified circuit diagram of an MDAC according to an embodiment of the present invention.

FIG. 2 is a simplified circuit diagram of an MDAC 200 according to an embodiment of the present invention. The MDAC 200 may include an amplifier 202 with transconductance $gm_2$, a common-gate amplifier 206, a current source 218, an input capacitor $C_i$, and a feedback capacitor $C_f$. The common-gate amplifier 206 may include an NMOS 214 and a current source 212. Parasitics at summing junction N3 in the circuit 210 are modeled by parasitic capacitor $C_{p2}$ at the first input of the amplifier 202. The capacitance of the next stage (such as device and parasitic capacitance) and any self-loading in the devices of the current stage is modeled by load capacitor $C_L$ at the output of amplifier 202. The first current source 212 may be connected to a reference voltage and the drain of the NMOS 214. The current source 218 may be connected to the source of the NMOS 214. An input capacitor may be coupled to a node N1 joining the source of the NMOS 214 and the current source 218. A first input to the amplifier 202 may be connected to a node N2 joining the current source 212 and the drain of the NMOS 214. A second input of the amplifier may be connected to ground. A feedback capacitor $C_f$ may be coupled to the output of the amplifier 202 and the first input of the amplifier 202. A load capacitor $C_L$ may be coupled to the output of the amplifier 202 (at node N3). In operation, the common-gate amplifier buffers the input capacitor $C_i$ from the feedback capacitor $C_f$, so that the MDAC gain gm2 is maintained, but the feedback factor (and hence, speed for a given power) is improved.

The feedback factor is improved, because effective capacitance does not contain input capacitance (equation given below). The circuit 210 also has reduced $C_{p2}$ compared to $C_{p1}$ of the conventional MDAC. The transfer function for the MDAC of FIG. 2A is represented by:

$$\frac{V_o}{V_i} = -\frac{C_t}{C_f} \cdot \frac{1 - s \cdot \frac{C_f}{g_{m2}}}{1 + s \cdot \left(\frac{C_{\mathit{eff}}}{g_{m2}}\right)}$$

Assuming the first stage does not limit bandwidth, the pole is given by:

$$s = \frac{-g_{m2}}{C_{\mathit{eff}}}$$

and effective capacitance is given by:

$$C_{\mathit{eff}} = C_{p2} + C_L\left(\frac{C_{p2}}{C_f} + 1\right)$$

Figure 3A:
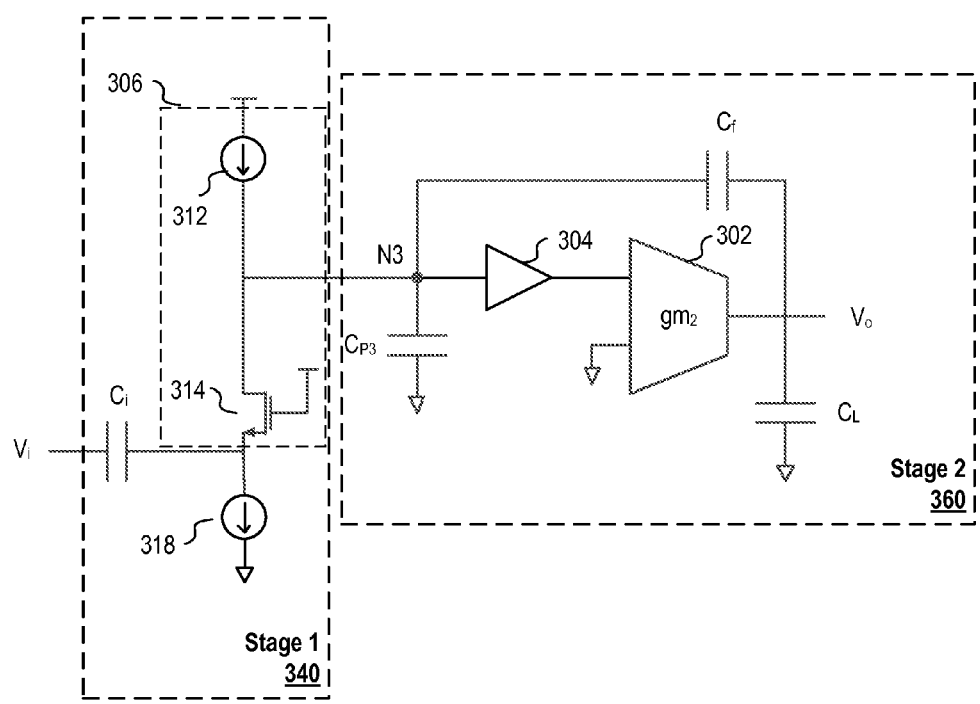
FIG. 3A is a simplified circuit diagram of an MDAC having a buffered input capacitor according to an embodiment of the present invention.

Thus, the circuit 210 has improved speed compared to the conventional MDAC of FIG. 1C FIG. 3A is a simplified circuit diagram of an MDAC according to an embodiment of the present invention. The MDAC 310 may include a first stage 340 and a second stage 360. The first stage 340 may include a common-gate amplifier 306, a current source 318, an input capacitor $C_i$. The second stage may include a buffer 304, an amplifier 302, and a feedback capacitor $C_f$. The common-gate amplifier 306 may include an NMOS 314 and a current source 312. Parasitics at summing junction N3 in the circuit 310 is modeled by parasitic capacitor $C_{p3}$ at the input of the buffer 304. The capacitance of the next stage (such as device and parasitic capacitance) and any self-loading in the devices of the current stage is modeled by load capacitor $C_L$ at the output of amplifier 302. The components have the same functions and are connected in the same way as in FIG. 2 unless described elsewhere herein. The buffer 304 may be coupled between node N3 and the input of the amplifier 302. The current source 318 may be implemented with an NMOS, a resistor, or a combination of NMOSs and resistors.

The circuit 310 has improved speed compared to the MDAC of FIG. 2, because the buffer 304 can reduce the parasitic capacitance by an order of magnitude, that is $C_{p3} \ll C_{p2}$ (equation given below). Thus, if $C_{p3} < C_f$, the effect with $C_L$ is greatly reduced. The transfer function for the MDAC of FIG. 3A is represented by:

$$\frac{V_o}{V_i} = -\frac{C_t}{C_f} \cdot \frac{1 - s \cdot \frac{C_f}{g_{m2}}}{1 + s \cdot \left(\frac{C_{\mathit{eff}}}{g_{m2}}\right)}$$

Assuming the first stage does not limit bandwidth, the pole is given by:

$$s = \frac{-g_{m2}}{C_{\textit{off}}}$$

and effective capacitance is given by:

$$C_{\textit{off}} = C_{p2} + C_L\left(\frac{C_{p2}}{C_f} + 1\right)$$

Figure 3B:
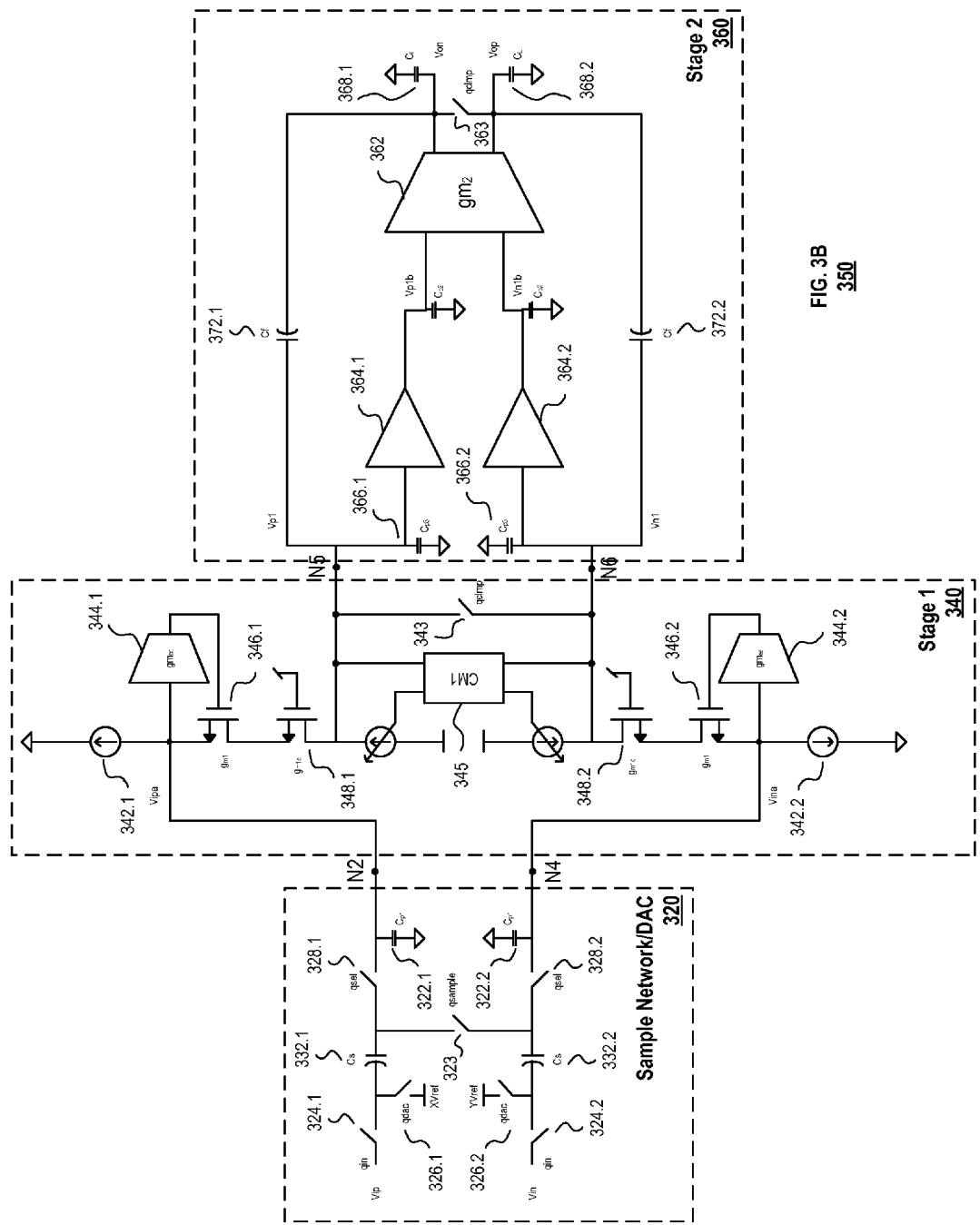
FIG. 3B is a simplified circuit diagram of a differential MDAC according to an embodiment of the present invention.

The MDAC 350 of the FIG. 3B embodiment is a differential system. The system develops an analog residue output ($V_{op}$ and $V_{on}$) from the input signal $V_{ip}$ and $V_{in}$. The input is quantized by a flash (not shown), then subtracted from the input signal and the remaining signal is Multiplied by the gain of the stage to produce the residue. The components of the MDAC 350 have the same functions and are connected in the same way as in FIG. 3A unless described elsewhere herein. The MDAC 350 may include a sample network 320 (also referred to as "DAC") for sampling an input signal, a first stage 340, and a second stage 360. The sample network 320 may sample an input signal that is then processed by the subsequent first stage 340 and second stage 360 to output an analog signal with components $V_{on}$ and $V_{op}$. The first stage 340 may buffer sampling capacitors 332.1 and 332.2 to improve the feedback factor. The second stage buffers 364.1 and 364.2 buffer the parasitic input capacitance to gm2 to further improve efficiency. The capacitor $C_{p3}$ 366.1 and 366.2 may be smaller than the $C_{p2}$ cap.

In an embodiment, the sample network 320 may include input switches 324.1 and 324.2, DAC switches 326.1 and 326.2, selection switches 328.1 and 328.1, a sampling switch 323, and sampling capacitors 332.1 and 332.2. Parasitic capacitance (as discussed above) is modeled as $C_{p1}$. Input switches 324.1 and 324.2 may connect input voltages to first terminals ("input terminals," for convenience) of sampling capacitors 332.1 and 332.2. Selection switches 328.1 and 328.2 may connect second terminals ("output terminals," for convenience) of sampling capacitors 332.1 and 332.2 nodes N2 and N4. The sampling switch 323 may connect the output terminals of the sampling capacitors 332.1 and 332.2 to each other. DAC switches 326.1 and 326.2 may connect input terminals of the sampling capacitors 332.1 and 332.2 to references voltages $XV_{ref}$ and $YV_{ref}$.

FIG. 3B also illustrates components of an exemplary first stage 340, which may include enhancement amplifiers 344.1 and 344.2, NMOSs 346.1, 346.2, 348.1 and 348.2, current sources 342.1 and 342.2, a common-mode controller 345, and a first clamp switch 343. FIG. 3B also illustrates components of an exemplary second stage 360, the MDAC 350 may include a second stage 360, which may include an amplifier 362, buffers 364.1 and 354.2, feedback capacitors (represented as $C_f$) and a second clamp switch 363. Parasitic capacitance (as discussed above) is modeled as $C_{p3}$ and load capacitance (as discussed above) is modeled as $C_L$. The second clamp switch 363 connects the feedback capacitors 372.1 and 372.2 to each other and the output of the amplifier 362. In a further embodiment, in the first stage 340, the common-mode controller 345 is coupled to the drains of NMOSs 348.1 348.2, and the first clamp switch 343 connects nodes N5 and N6 to each other.

The MDAC 350 may operate in several phases of operation. During a clamp/acquire phase, input switches 324.1, 324.2, sampling switch 323, first clamp switch 343, and second clamp switch 363 may be closed such that input terminals of the sampling capacitors 332.1 and 332.2 are pulled to the input voltages $V_{ip}$ and $V_{in}$, input terminals of the feedback capacitors 372.1 and 372.2 are substantially isolated from the effects of the sampling capacitors 332.1 and 332.2, and feedback capacitors 372.1 and 372.2 are at the same potential. This stores the input samples on the sampling capacitors 332.1 and 332.2 without affecting the feedback capacitors 372.1 and 372.2. The input switches 324.1, 324.2, sampling switch 323, first clamp switch 343, and second clamp switch 363 are then opened. During a gain (also referred to as a hold or amplify) phase, DAC switches 326.1 and 326.2 are closed such that the input terminals of the sampling capacitors 332.1 and 332.2 are shorted to the appropriate quantized version of the input signal $XV_{ref}$ and $YV_{ref}$ that is provided by a flash (not shown). The selection switches 328.1 and 328.2 are then closed to allow the charge stored on the sampling capacitors 332.1 and 332.2 to be transferred to the feedback capacitors 372.1 and 372.2 to develop the output voltages $V_{on}$ and $V_{op}$. Operation of the MDAC 350 may repeat for as long as desired.

Figure 4:
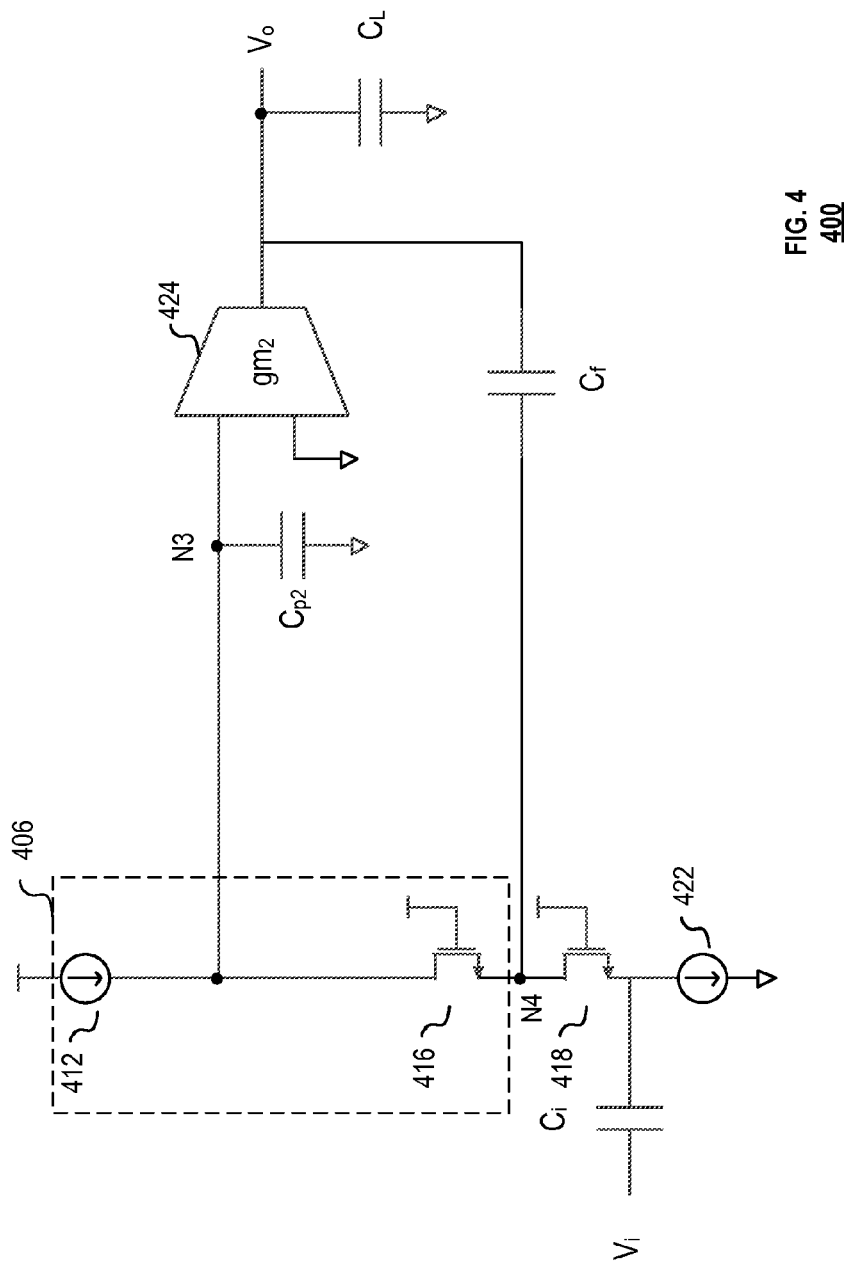
FIG. 4 is a simplified circuit diagram of an MDAC having cascode compensation according to an embodiment of the present invention.

FIG. 4 is a simplified circuit diagram of an MDAC 400 according to a further embodiment of the present invention. The components have the same functions and are connected in the same way as in FIG. 2 unless described elsewhere herein. The MDAC 400 may further include an NMOS 418. The source of the NMOS 418 may be connected to the source of the NMOS 416 and the current source 422 at node N4. As contrasted with FIG. 3A, the feedback capacitor $C_f$ may be used to cascade compensate a two-stage amplifier by being connected to the output of the amplifier 424 and node N4.

In the ideal case in which the cascode buffer is ideal, the dominate pole is improved by removal of the +1 term in the effective capacitance (see equation below). When the cascode is real, performance is improved if its bandwidth is far from the dominate pole. The transfer function for the MDAC 400 of FIG. 4 is represented by:

$$\frac{V_o}{V_i} = -\frac{C_t}{C_f} \cdot \frac{1 - s \cdot \frac{C_f}{g_{m2}}}{1 + s \cdot \left(\frac{C_{\textit{off}}}{g_{m2}}\right)}$$

Assuming the first stage does not limit the bandwidth, the pole is given by:

$$s = \frac{-g_{m2}}{C_{\textit{off}}}$$

and effective capacitance is given by:

$$C_{\textit{off}} = C_{p2} + C_L\left(\frac{C_{p2}}{C_f}\right)$$

Figure 5:
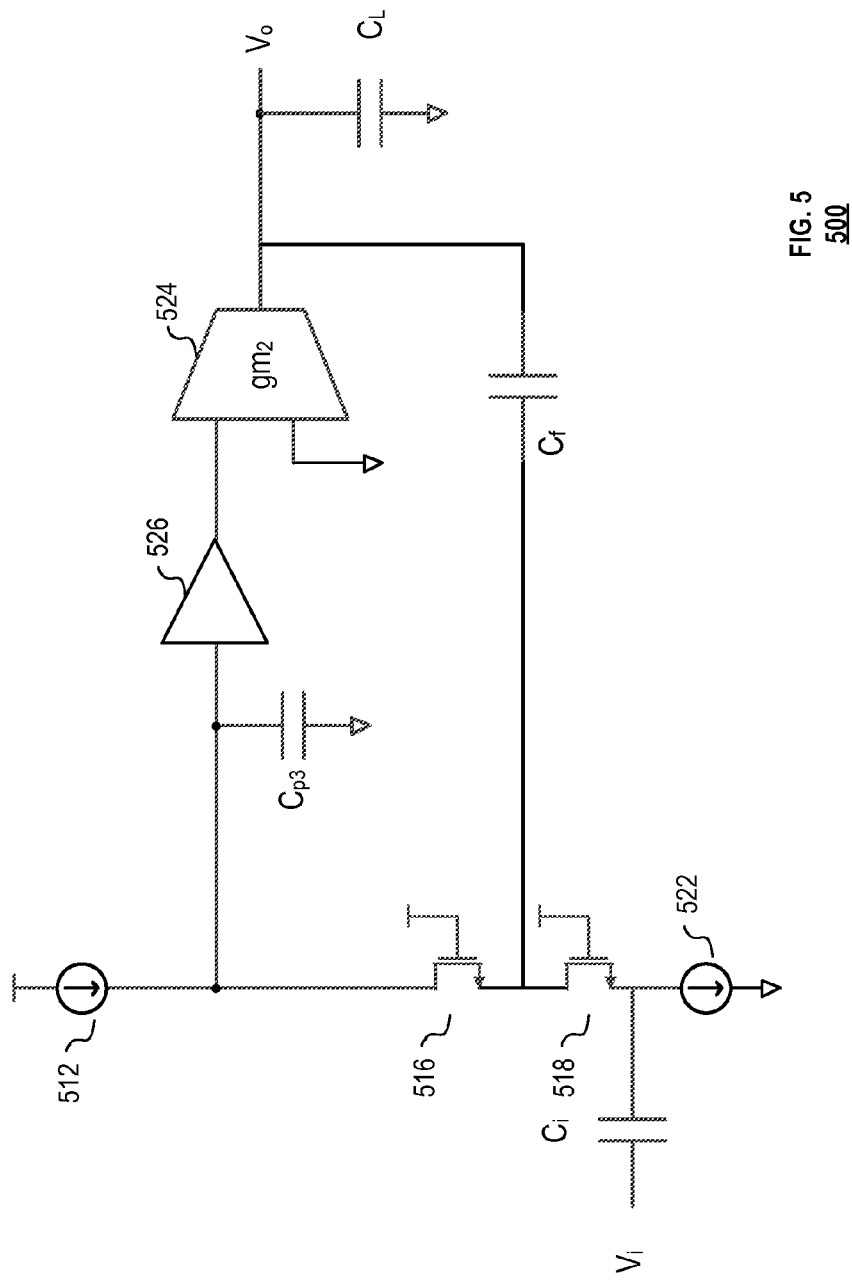
FIG. 5 is a simplified circuit diagram of an MDAC having cascode compensation and a second stage buffer according to an embodiment of the present invention.

FIG. 5 is a simplified circuit diagram of an MDAC 500 according to a further embodiment of the present invention. The components have the same functions and are connected in the same way as in FIG. 4 unless described elsewhere herein. The MDAC 500 may further include a buffer 526. An input of buffer 526 is connected to the node N3 and an input of the buffer 526 is connected to the input of the amplifier 524.

The circuit 500 has improved speed compared to the MDAC of FIG. 4, because $C_{p3} \ll C_{p2}$. The transfer function for the MDAC 500 of FIG. 5 is represented by:

$$\frac{V_o}{V_i} = -\frac{C_t}{C_f} \cdot \frac{1 - s \cdot \frac{C_f}{g_{m2}}}{1 + s \cdot \left(\frac{C_{\textit{off}}}{g_{m2}}\right)}$$

where the bandwidth is given by:

$$s = \frac{-g_{m2}}{C_{\textit{off}}}$$

and effective capacitance is given by:

$$C_{\textit{off}} = C_{p2} + C_L \left(\frac{C_{p2}}{C_f}\right)$$

Figure 6B:
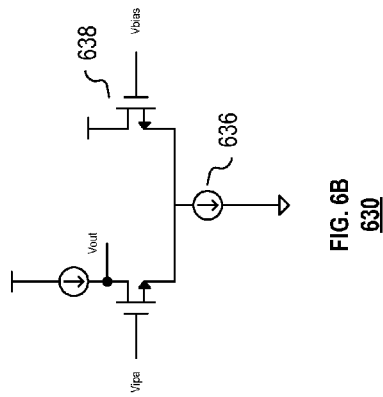
FIG. 6B is a simplified circuit diagram of an enhancement amplifier of an MDAC according to an embodiment of the present invention.
Figure 6C:
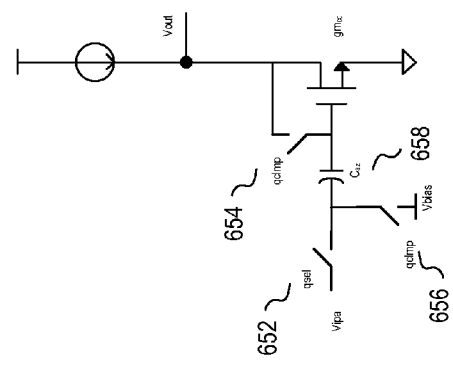
FIG. 6C is a simplified circuit diagram of an enhancement amplifier of an MDAC according to an embodiment of the present invention.
Figure 6A:
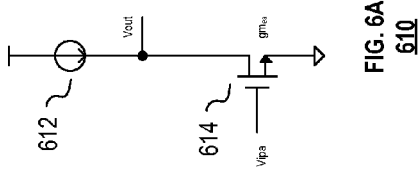
FIG. 6A is a simplified circuit diagram of an enhancement amplifier of an MDAC according to an embodiment of the present invention.

FIGS. 6A-6C are simplified circuit diagrams of enhancement amplifiers 610, 630, and 650 according to an embodiment of the present invention. They may each be used as the first stage amplifier in an MDAC (such as the amplifiers 344.1 and 344.2 shown in FIG. 3B). The enhancement amplifier 610 may include a current source 612 connected to the drain of an NMOS 614. The enhancement amplifier 630 may include the same components as the enhancement amplifier 610, and may further include a second NMOS 638 and a second current source 636 that connects the sources of the NMOSs 634 and 638. The gate of the NMOS 638 may be connected to a bias voltage $V_{bias}$. The enhancement amplifier 630 may be advantageously designed such that $V_{gs}$ is decoupled from setting the DC voltage at $V_{ipa}$. The enhancement amplifier 650 may include the same components as the enhancement amplifier 610, and may further include a selection switch 652, a first clamp switch 656, a second clamp switch 654, and a capacitor 658 such that the offset of the device $Gm_{ea}$ is auto-zeroed in the clamp phase. The enhancement amplifier 650 may be advantageously designed to have lower offset. An enhancement amplifier may also be designed to be a combination of the enhancement amplifier 630 and the enhancement amplifier 650 (not shown) to advantageously have even less offset.

Figure 7B:
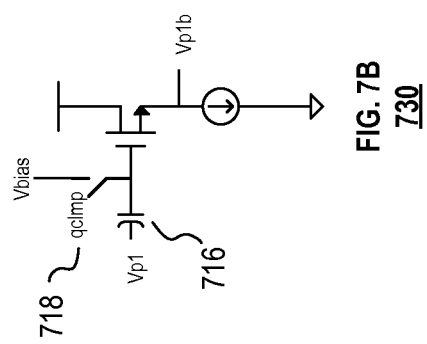
FIG. 7B is a simplified circuit diagram of a second stage buffer in an MDAC according to an embodiment of the present invention.
Figure 7A:
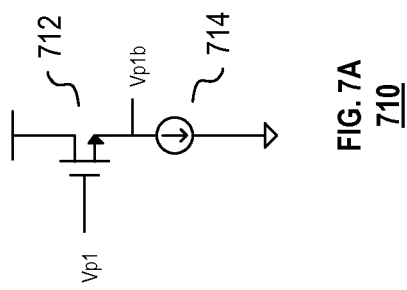
FIG. 7A is a circuit diagram of an NMOS follower than can be used as the stage two buffer in an MDAC according to an embodiment of the present invention.

FIGS. 7A and 7B are simplified circuit diagrams of buffers 710 and 730 according to an embodiment of the present invention. They may each be used as the second stage buffer in an MDAC (such as the buffers 364.1 and 364.2 shown in FIG. 3B). The buffer 710 may be an NMOS follower having an NMOS 712 and a current source 714 connected to the source of the NMOS 712. The buffer 730 may include the same components as the buffer 710, and may further include a capacitor 716 and a clamp switch 718 to have a DC level shift. The capacitor 716 and the clamp switch 718 may each be connected to the gate of the NMOS.

Figure 8:
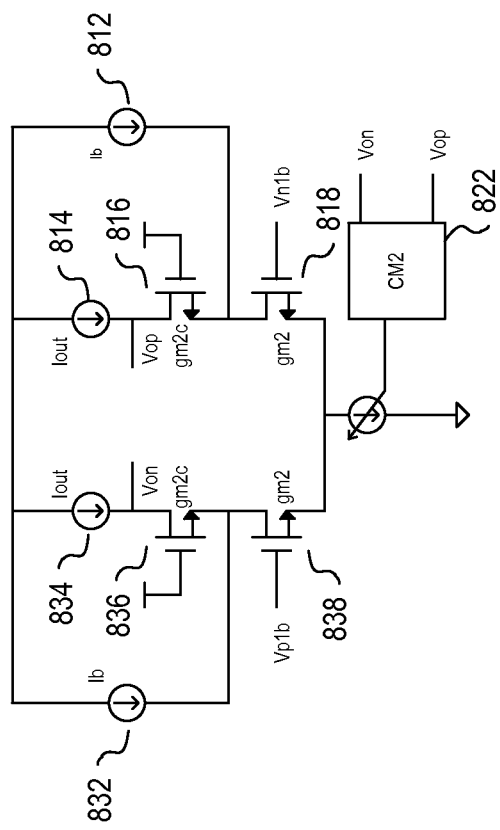
FIG. 8 is a simplified circuit diagram of a second stage amplifier in an MDAC according to an embodiment of the present invention.

FIG. 8 is a simplified circuit diagram of an amplifier 800 according to an embodiment of the present invention that may be used as the second stage amplifier in an MDAC (such as the amplifier 362 shown in FIG. 3B). The amplifier 800 may be a common-source differential pair with cascodes to increase gain. The amplifier 800 may include a common mode control 822 and NMOSs 816, 818, 836, and 838. In an embodiment, the common mode control 822 may be implemented by a clicker circuit. In another embodiment, the amplifier may advantageously designed to further include current sources 812 and 832. These current sources improve gm2 (818/838) without the penalty of self-loading the output of the amplifier by increasing the cascode devices (816/836) unnecessarily.

The descriptions and illustrations of the embodiments above should be read as exemplary and not limiting. For example, NMOSs may be implemented with PMOSs or other transistors in the embodiments described above. Modifications, variations, and improvements are possible in light of the teachings above and the claims below, and are intended to be within the spirit and scope of the invention.

What is claimed is:

1. A method for improving the efficiency of a switched-capacitor amplifier having a sampling capacitor and a feedback capacitor, the method comprising:
    buffering the sampling capacitor from the feedback capacitor such that a gain of the amplifier is maintained and a feedback factor of the amplifier is increased by removing a capacitance of the sampling capacitor from the feedback factor.

2. The method of claim 1, further comprising performing a cascode compensation.

3. The method of claim 1, further comprising reducing a parasitic capacitance by using a buffer.

4. The method of claim 1, wherein the feedback factor is a ratio of a capacitance of the feedback capacitor to the sum of: the capacitance of the feedback capacitor and a parasitic capacitance.

5. The method of claim 1 wherein the switched-capacitor amplifier has an input switch coupled to the sampling capacitor, a DAC switch coupled to the sampling capacitor and a reference voltage, a selection switch coupled to the sampling capacitor, a sampling switch coupled to the selection switch and the sampling capacitor, and a clamp switch coupled to the feedback capacitor, the method comprising:
    closing the input switch, the sampling switch, and the clamp switch in a first mode of operation;
    opening the input switch, the sampling switch, and the clamp switch in a second mode of operation; and
    closing the DAC switch and the selection switch in the second mode of operation.

6. A multiplying digital-to-analog converter comprising:
    a first stage including:
        an input capacitor coupled to an input of the multiplying digital-to-analog converter; and
        a common-gate amplifier coupled to the input capacitor and a first current source; and
    a second stage coupled to an output of the first stage, the second stage including:
        an amplifier having an input coupled to an intermediate node of the common-gate amplifier; and
        a feedback capacitor coupled to the input of the amplifier and an output of the amplifier.

7. The multiplying digital-to-analog converter according to claim 6, wherein the common-gate amplifier includes:
    an NMOS having a drain connected to a second current source and a source connected to the first current source.

8. The multiplying digital-to-analog converter according to claim 6, further comprising:
    an NMOS having a drain connected to the common-gate amplifier; and
    an enhancement amplifier having an output connected to a gate of the NMOS and an input connected to a source of the NMOS and the first current source.

9. The multiplying digital-to-analog converter according to claim 6, further comprising a buffer coupled to the intermediate node of the common-gate amplifier and the input of the amplifier.

10. The multiplying digital-to-analog converter according to claim 8, further comprising a buffer coupled to the intermediate node of the common-gate amplifier and the input of the amplifier.

11. A multiplying digital-to-analog converter comprising:
a first stage including:
an input capacitor coupled to an input of the multiplying digital-to-analog converter;
a common-gate amplifier coupled to the NMOS; and
an NMOS having a drain coupled to the common-gate amplifier, and a source coupled to a first current source; and
a second stage coupled to an output of the first stage, the second stage including:
an amplifier having an input coupled to an intermediate node of the common-gate amplifier; and
a feedback capacitor having an input coupled to the common-gate amplifier and the drain of the NMOS, and an output coupled to an output of the amplifier.

12. The multiplying digital-to-analog converter according to claim 11, further comprising a buffer coupled to the intermediate node of the common-gate amplifier and the input of the amplifier.

13. The multiplying digital-to-analog converter according to claim 10, further comprising:
a sample network including:
at least one input switch connected to the input of the multiplying digital-to-analog converter and the input capacitor;
at least one selection switch connected to the input capacitor and an input to the first stage;
at least one DAC switch connected to the input capacitor and a reference voltage;
a sample switch connected to the input capacitor and the at least one selection switch; and
a first clamp switch connected to the output of the first stage and the input of the second stage;
wherein the first stage further includes a common-mode controller connected to the output of the common-gate amplifier and the output of the first stage; and
the second stage further includes a second clamp switch connected to the output of the amplifier.

14. The multiplying digital-to-analog converter according to claim 13, wherein the enhancement amplifier includes:
a first NMOS having a gate coupled to the input of the multiplying digital-to-analog converter and having a source;
a second NMOS having a source coupled to the source of the first NMOS and having a gate connected to a bias voltage;
a first current source coupled to a drain of the first NMOS; and
a second current source coupled to the respective sources of the first NMOS and the second NMOS.

15. The multiplying digital-to-analog converter according to claim 13, wherein the enhancement amplifier includes:
a current source;
an NMOS having a drain coupled to the current source;
a selection switch connected to the input of the multiplying digital-to-analog converter;
a first clamp switch connected to the gate and the drain of the NMOS;
a second clamp switch connected to a bias voltage;
a capacitor having a first terminal connected to the second clamp switch and the gate of the NMOS, and a second terminal connected to the selection switch and the first clamp switch.

16. The multiplying digital-to-analog converter according to claim 13, wherein the buffer includes:
an NMOS;
a current source connected to a source of the NMOS;
a capacitor connected to the gate of the NMOS; and
a clamp switch connected to the capacitor and a bias voltage.

17. The multiplying digital-to-analog converter according to claim 13, wherein the amplifier of the second stage includes:
a common-mode controller;
a first current source having a first terminal and a second terminal;
a second current source having a first terminal coupled to the first terminal of the first current source;
a first NMOS having a drain connected to the second terminal of the first current source;
a second NMOS having a drain connected to the second terminal of the second current source;
a third NMOS having a drain connected to the source of the first NMOS and a source connected to the common-mode controller; and
a fourth NMOS having a drain connected to the source of the second NMOS and a source connected to the common-mode controller.

18. The multiplying digital-to-analog converter according to claim 13, wherein the amplifier of the second stage further includes:
a third current source having a first terminal coupled to the respective first terminals of the first and the second current sources, and a second terminal coupled to a node joining the source of the first NMOS and the drain of the third NMOS; and
a fourth current source having a first terminal coupled to the respective first terminals of the first, the second, and the third current sources, and a second terminal coupled to a node joining the source of the second NMOS and the drain of the fourth NMOS.

\* \* \* \* \*